(12) United States Patent
Inoue

(10) Patent No.: US 7,859,010 B2
(45) Date of Patent: Dec. 28, 2010

(54) BI-DIRECTIONAL SEMICONDUCTOR ESD PROTECTION DEVICE

(75) Inventor: Tomoki Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 429 days.

(21) Appl. No.: 12/014,449

(22) Filed: Jan. 15, 2008

(65) Prior Publication Data
US 2008/0173894 A1 Jul. 24, 2008

(30) Foreign Application Priority Data
Jan. 15, 2007 (JP) ............................. 2007-006188

(51) Int. Cl.
*H01L 29/861* (2006.01)
(52) U.S. Cl. ...................... 257/110; 257/104; 257/173; 257/E29.215
(58) Field of Classification Search ................. 257/104, 257/110, 173, E29.215
See application file for complete search history.

(56) References Cited

U.S. PATENT DOCUMENTS

| | | | |
|---|---|---|---|
| 3,435,515 A * | 4/1969 | Connor et al. .............. 438/134 |
| 5,359,211 A | 10/1994 | Croft | |
| 5,528,064 A | 6/1996 | Thiel | |
| 5,880,511 A * | 3/1999 | Yu et al. ...................... 257/497 |
| 6,060,763 A * | 5/2000 | Yamagishi et al. .......... 257/577 |
| 6,791,123 B2 * | 9/2004 | Yamagishi et al. .......... 257/174 |
| 7,321,138 B2 * | 1/2008 | Ducreux ...................... 257/109 |
| 7,538,395 B2 * | 5/2009 | Keena et al. ................. 257/361 |
| 7,576,370 B2 * | 8/2009 | Gee et al. ..................... 257/173 |
| 7,579,632 B2 * | 8/2009 | Salih et al. ................... 257/173 |
| 2007/0120193 A1 * | 5/2007 | Inoue .......................... 257/358 |
| 2009/0250721 A1 * | 10/2009 | Sone et al. ................... 257/173 |
| 2010/0001783 A1 * | 1/2010 | Ronsisvalle et al. ......... 327/438 |

FOREIGN PATENT DOCUMENTS

JP  08-316456  11/1996

* cited by examiner

*Primary Examiner*—Anh D Mai
(74) *Attorney, Agent, or Firm*—Turocy & Watson, LLP

(57) ABSTRACT

A semiconductor substrate has a second conductivity type cathode layer formed thereon. The cathode layer has a first conductivity type base layer formed thereon. A first anode region of the second conductivity type is formed in the surface of the base layer. A second anode region of the first conductivity type is formed in the first anode region. A first semiconductor region of the first conductivity type is formed in contact with the semiconductor substrate. A second semiconductor region of the second conductivity type is formed adjacent to the first semiconductor region and in contact with the cathode layer. An intermediate electrode is formed on the surfaces of the first semiconductor region and the contact region.

20 Claims, 6 Drawing Sheets

BI-DIRECTIONAL SEMICONDUCTOR ESD PROTECTION DEVICE

CROSS REFERENCE TO RELATED APPLICATIONS

This application is based on and claims the benefit of priority from prior Japanese Patent Application No. 2007-6188, filed on Jan. 15, 2007, the entire contents of which are incorporated herein by reference.

BACKGROUND OF THE INVENTION

1. Field of the Invention

The present invention relates to a semiconductor device, and particularly, to the technology field of a semiconductor device for ESD protection.

2. Description of the Related Art

A zener diode is a device to protect electrical equipment or the like from an electrostatic discharge (ESD). The zener diode undergoes, when a high voltage pulse such as a surge is applied between the anode and the cathode of the diode, a zener breakdown or an avalanche breakdown. This phenomenon flows a current between the anode and the cathode, thereby suppressing the voltage increase. The zener diode thus functions as the ESD protection device. For a high-frequency and high-voltage pulse, however, the zener diode needs a large junction area to ensure a sufficient capacitance. This is an obstacle to a more compact zener diode.

As an alternative ESD protection device that can provide a smaller junction area and thus a more compact device size than the zener diode, a bi-directional two-terminal thyristor is known. The thyristor is disclosed in, for example, JPH 8-316456. The bi-directional two-terminal thyristor is formed to have a vertical shape on the semiconductor substrate such as a silicon substrate. The semiconductor substrate should thus have an N-type semiconductor region and a P-type semiconductor region formed on the respective sides thereof. Unfortunately, it requires a complicated manufacturing process to form the n and P-type semiconductor regions on the respective sides of the semiconductor substrate. This requires significant time and effort, resulting in a high cost. In addition, it is difficult to provide a process such as grinding to the substrate sides on which the n and P-type semiconductor regions are formed. This prevents the thyristor from being more compact.

SUMMARY OF THE INVENTION

A semiconductor device according to an aspect of the present invention includes a semiconductor substrate of a first conductivity type and a cathode layer of a second conductivity type formed on the semiconductor substrate; a base layer of the first conductivity ftype formed on the cathode layer; a first anode region of the second conductivity type formed in a surface of the base layer; a second anode region of the first conductivity type formed in the first anode region; a first semiconductor region of the first conductivity type formed on the surface of the base layer and in contact with the semiconductor substrate, said first semiconductor region being apart from the first anode region; a second semiconductor region of the second conductivity type formed adjacent to the first semiconductor region and in contact with the cathode layer, said second semiconductor region being apart from the first anode region; a contact region of the second conductivity type formed in a surface including a boundary portion between the first semiconductor region and the second semiconductor region; a cathode electrode formed on a surface of the semiconductor substrate; an anode electrode formed on surfaces of the first anode region and the second anode region; and an intermediate electrode formed on surfaces of the first semiconductor region and the contact region.

A semiconductor device according to another aspect of the present invention includes: a semiconductor substrate of a first conductivity type and a cathode layer of a second conductivity type formed on the semiconductor substrate; a base layer of the first conductivity type formed on the cathode layer; a first anode region of the second conductivity type formed in a surface of the base layer; a second anode region of the first conductivity type formed in the first anode region; a first semiconductor region of the first conductivity type formed on the surface of the base layer and in contact with the semiconductor substrate, said first semiconductor region being apart from the first anode region; a second semiconductor region of the second conductivity type formed adjacent to the first semiconductor region and in contact with the cathode layer, said second semiconductor region being apart from the first anode region; a cathode electrode formed on a surface of the semiconductor substrate; an anode electrode formed on surfaces of the first anode region and the second anode region; and an intermediate electrode formed on surfaces of the first semiconductor region.

DETAILED DESCRIPTION OF THE EMBODIMENTS

Preferred embodiments of the present invention will be described below.

Figure 1:
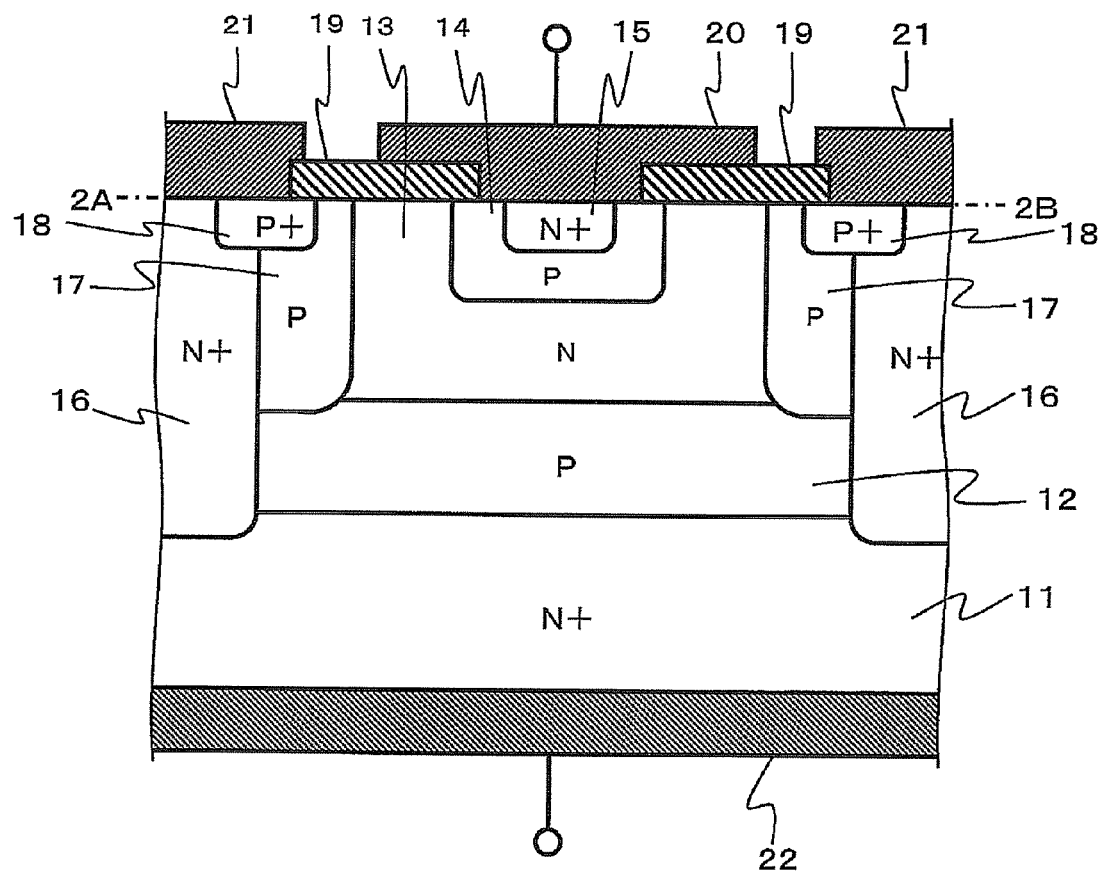
FIG. 1 shows a structure of a semiconductor device according to an embodiment of the present invention.
Figure 2:
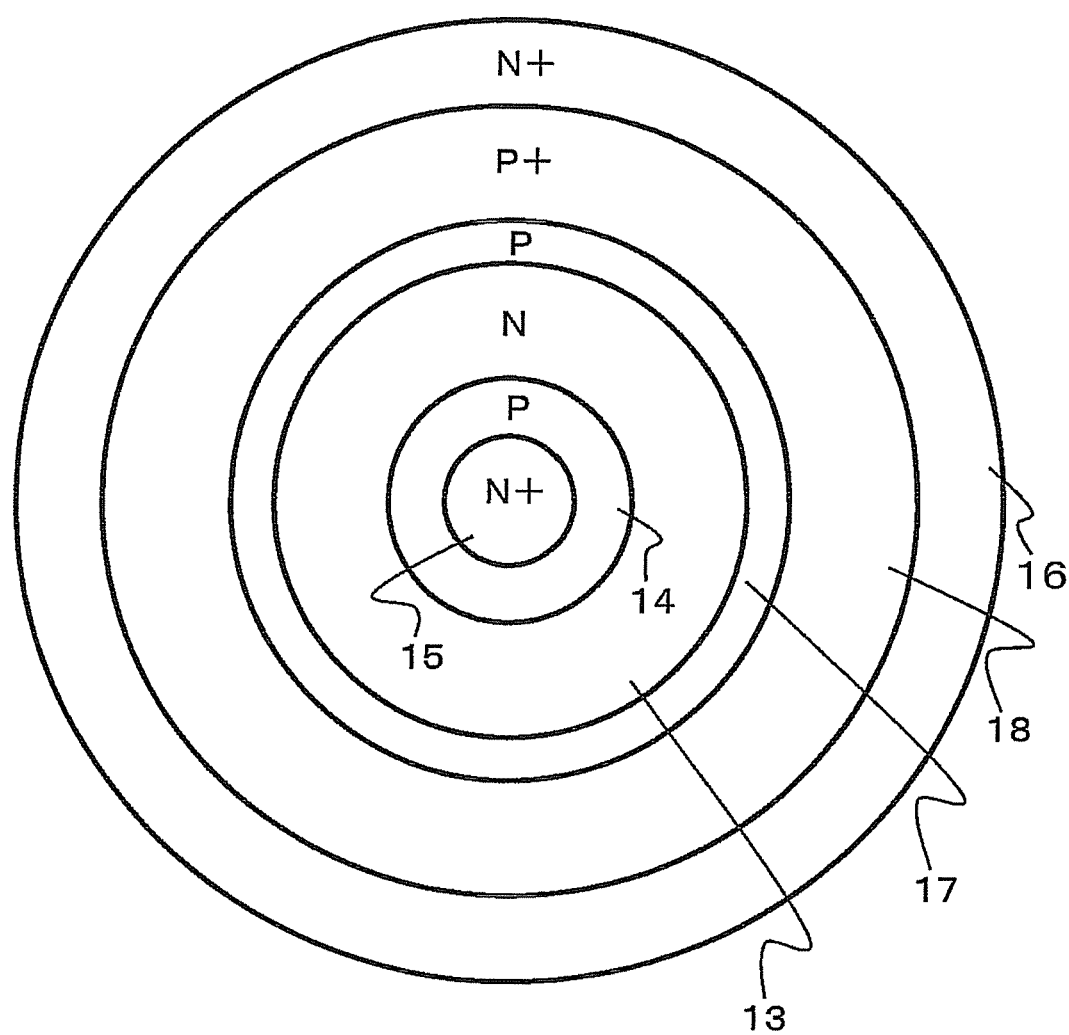
FIG. 2 is a cross sectional view taken along the cutting line 2A-2B of FIG. 1.

FIG. 1 is a cross sectional view of a trigger diode as a semiconductor device of this embodiment in a direction perpendicular to a substrate. FIG. 2 is a cross sectional view taken along the line 2A-2B of FIG. 1.

The trigger diode of this embodiment includes an $N^+$-type semiconductor substrate 11 and a P-type cathode layer 12 formed thereon. The substrate 11 includes silicon (Si) with impurities such as phosphorous (P) doped therein. The cathode layer 12 includes epitaxially grown silicon with impurities such as boron (B) doped therein. The cathode layer 12 has an N-type base layer 13 formed thereon. The base layer 13 includes epitaxially grown silicon with impurities such as phosphorous (P) doped therein.

On the surface of the base layer 13, a resist is formed and patterned by photolithography to form a mask. Some regions where no resist is formed are then implanted with impurity ions to form each region.

Specifically, the base layer 13 is implanted with ions such as boron (B) into regions in which anodes are to be formed. A P-type first anode region 14 is thus formed on the surface of the base layer 13. The first anode region 14 is then implanted with ions such as phosphorous (P) to form an N+-type second anode region 15.

In the base layer 13, a first semiconductor region 16 is formed circumferentially around the first and second anode regions 14 and 15 (see FIG. 2). The first semiconductor region 16 is formed as an N+-type ring region by implanting ions such as phosphorous (P) or arsenic (As).

In order to form the first semiconductor region 16, ions such as phosphorous (P) are implanted with the accelerating voltage of the ions such as P adjusted so that the first semiconductor region 16 penetrates the cathode layer 12 to the semiconductor substrate 11. Instead of this, a diffusion period after a ion implantation may be adjusted so that the first semiconductor region 16 penetrates the cathode layer 12 to the semiconductor substrate 11. The first semiconductor region 16 is thus formed adjacent to the semiconductor substrate 11 at its bottom surface.

Inside the first semiconductor region 16 (on the side where the first anode region 14 is formed), a second semiconductor region 17 is formed. The second semiconductor region 17 is formed adjacent to the first semiconductor region 16 and is formed circumferentially around the first and second anode regions 14 and 15 (see FIG. 2). The second semiconductor region 17 is formed by implanting ions such as boron (B). The region 17 is formed as a P-type ring region inside the first semiconductor region 16 that is formed as a ring region. In order to form the second semiconductor region 17, ions such as boron (B) are implanted with the accelerating voltage of the ions such as boron (B) adjusted so that the second semiconductor region 17 is in contact with the cathode layer 12. Instead of this, a diffusion period after a ion implantation may be adjusted so that the second semiconductor region 17 contacts the cathode layer 12. The second semiconductor region 17 is thus formed adjacent to the cathode layer 12 at its bottom surface.

In the surface of the boundary of the first and second semiconductor regions 16 and 17, ions such as boron (B) are implanted to form a P+-type contact region 18. The contact layer 18 serves to provide an ohmic contact between the p-type ring layer and the intermediate electrode 21. The contact layer 18 may be omitted, if the impurity concentration of the p-type ring layer is high enough at it surface to obtain an ohmic contact.

Furthermore, not-shown highly-doped n-type semiconductor layer may be formed on the surface of the first semiconductor region 16 to ensure ohmic contact between the first semiconductor region 16 and the intermediate electrode 20.

To cover at least the base layer 13 and the second semiconductor region 17 exposed on the surface, an insulating layer 19 including silicon dioxide ($SiO_2$) is formed. Specifically, the insulating layer 19 is formed circumferentially in a portion between an anode electrode 20 and an intermediate electrode 21 as described below.

On the surfaces of the first and second anode regions 14 and 15, the anode electrode 20 is formed. On the surfaces of the first semiconductor region 16 and the contact region 18, the intermediate electrode 21 is formed. In addition, on the back side of the semiconductor substrate 11, a cathode electrode 22 is formed. Note that before the cathode electrode 22 is formed, the semiconductor substrate 11 may be ground. The semiconductor device may thus be formed thinner, providing a more compact trigger diode.

[Semiconductor Device Operation]

The operation of the trigger diode as a semiconductor device of this embodiment will now be described.

Figure 3:
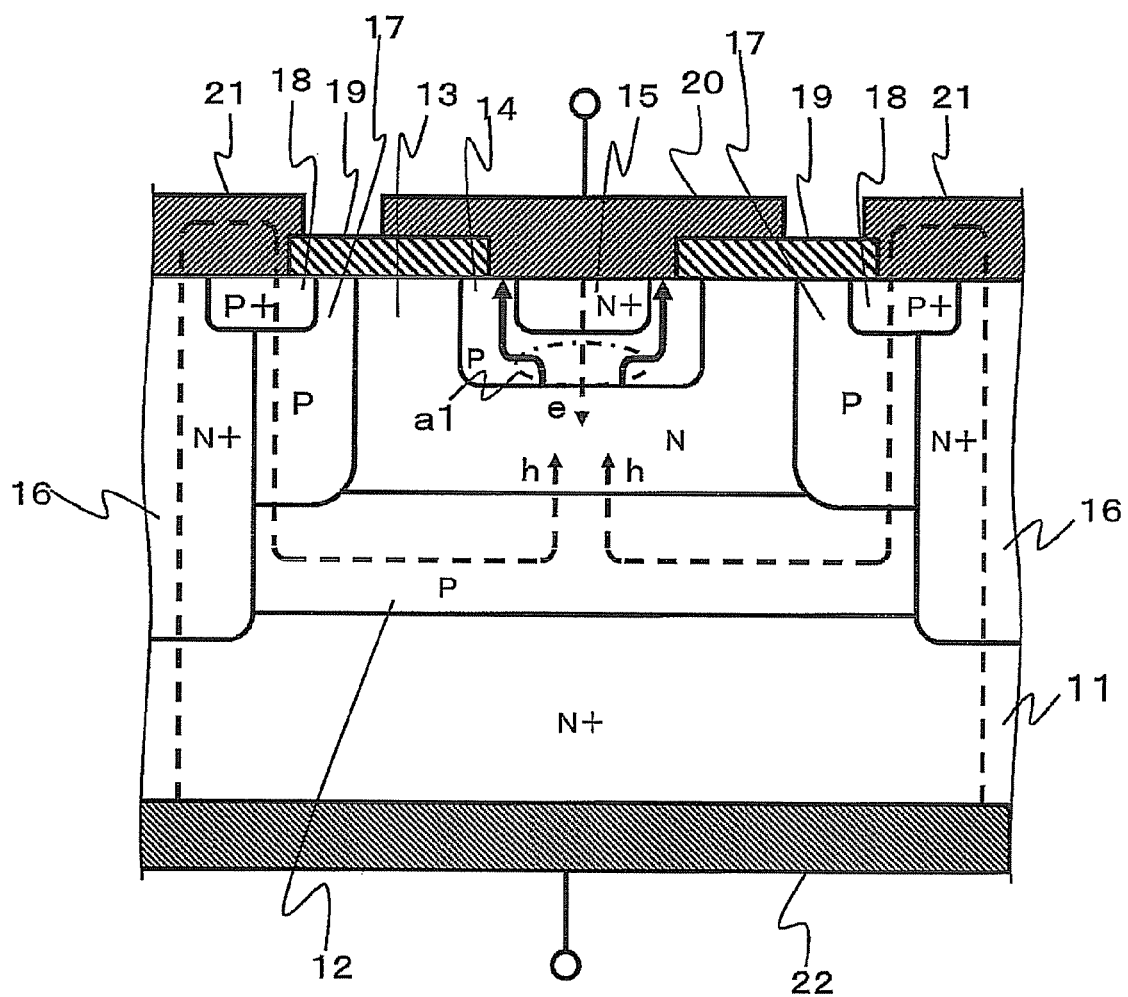
FIG. 3 illustrates an operation of the semiconductor device of the embodiment.

FIG. 3 illustrates an operation of the trigger diode of this embodiment. In FIG. 3, the anode electrode 20 is applied with a negative voltage and the cathode electrode 22 is applied with a positive voltage (i.e., the cathode electrode 22 is applied with a voltage higher than the voltage applied to the anode electrode 20 by a predetermined value or more). The junction between the P-type first anode region 14 and the N-type base layer 13 is thus reverse-biased. In addition, the junction between the N-type base layer 13 and the P-type cathode layer 12 is forward-biased. When the voltage applied between the first anode region 14 and the base layer 13 is higher than the breakdown voltage of the junction between the first anode region 14 and the base layer 13, holes generated in the junction area flow through the first anode region 14 to the anode electrode 20, as indicated by the arrowed solid lines in FIG. 3. A hole current thus flows through the first anode region 14 to the anode electrode 20. The first anode region 14 has a resistance component due to a sheet resistance. In the first anode region 14, therefore, the portion a1 enclosed by the long and short dashed lines (see FIG. 3) is higher in potential than the anode electrode 20. When the potential of the portion a1 is equivalent to or higher than the diffusion potential between the N+-type second anode region 15 and the P-type first anode region 14, electrons are directly injected from the second anode region 15 to the base layer 13 through the first anode region 14 as indicated by the arrow broken line e in FIG. 3. The junction between the base layer 13 and the cathode layer 12 is forward-biased as described above. The P-type cathode layer 12 is electrically connected to the cathode electrode 22 through the P-type second semiconductor region 17, the p+-type contact region 18, the intermediate electrode 21, the n+-type first semiconductor region 16, and the n+-type semiconductor substrate 11. In response to the amount of electrons injected from the second anode region 15 to the base layer 13, therefore, holes are injected from the cathode electrode 22 through the cathode layer 12 to the base layer 13 as indicated by the arrow broken line h in FIG. 3. The base layer 13 is thus in a highly-injection state and causes conductivity modulation, resulting in an extremely low resistance and a turned-on state (a latch-up state).

Figure 4:
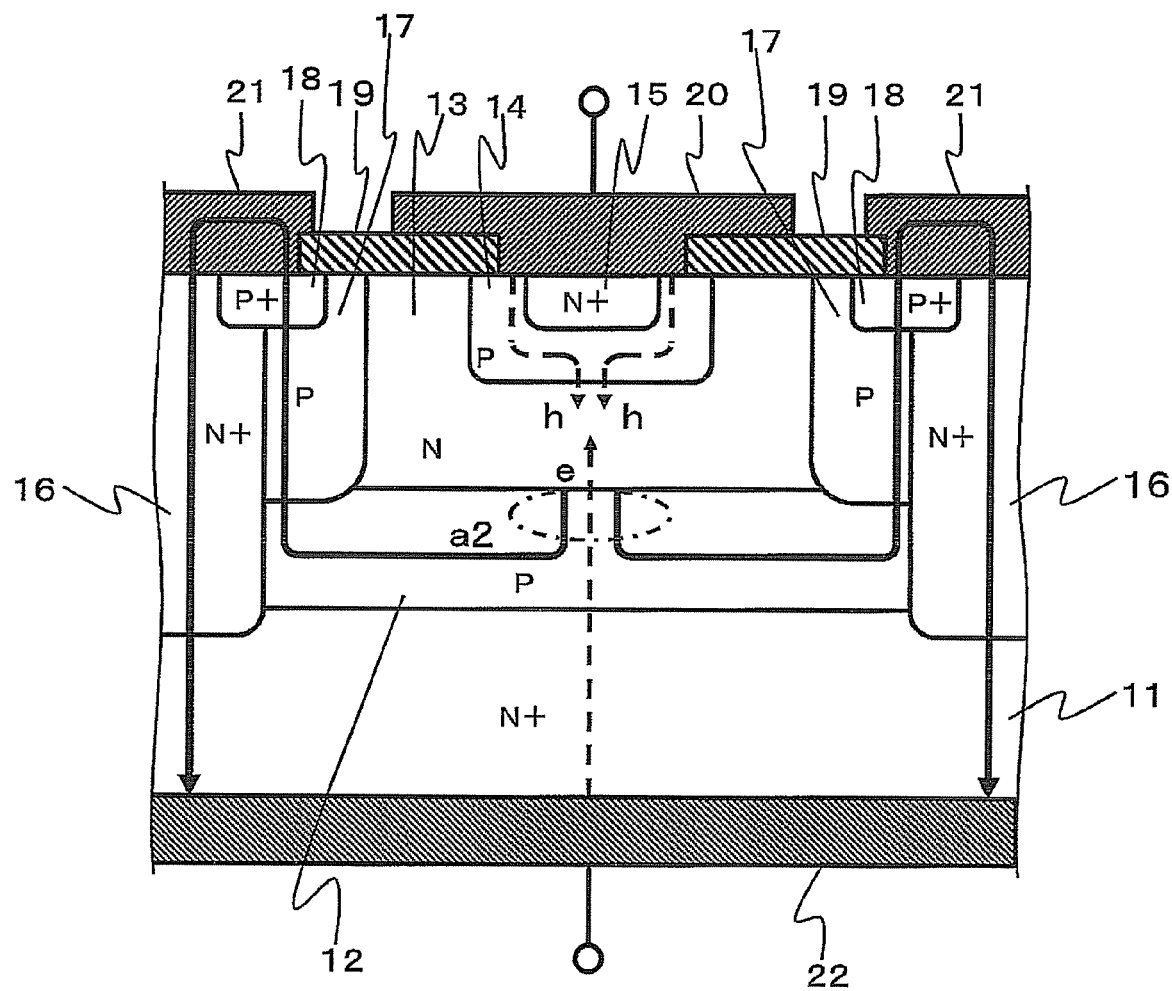
FIG. 4 illustrates an operation of the semiconductor device of the embodiment.

FIG. 4 illustrates another operation of the trigger diode of this embodiment. In FIG. 4, the anode electrode 20 is applied with a positive voltage and the cathode electrode 22 is applied with a negative voltage (i.e., the anode electrode 20 is applied with a voltage higher than the voltage applied to the cathode electrode 22 by a predetermined value or more). The junction between the P-type first anode region 14 and the N-type base layer 13 is thus forward-biased. In addition, the junction between the N-type base layer 13 and the P-type cathode layer 12 is reverse-biased. When the voltage applied between the base layer 13 and the cathode layer 12 is higher than the breakdown voltage of the junction between the base layer 13 and the cathode layer 12, holes generated in the junction area flow through the P-type cathode layer 12, the P-type second semiconductor region 17, P+-type contact region 18, the intermediate electrode 21, N+-type first semiconductor region 16, and the N+-type semiconductor substrate 11 to the cathode electrode 22, as indicated by the arrowed solid line in FIG. 3. A hole current thus flows through the cathode layer 12 to the cathode electrode 22. The cathode layer 12 has a resistance component due to a sheet resistance. In the cathode layer 12, therefore, the portion a2 enclosed by the long and short dashed lines (see FIG. 4) is higher in potential than the cathode electrode 22. When the potential of the portion a2 is equivalent to or higher than the diffusion potential between the N+-type semiconductor substrate 11 and the P-type cathode layer 12, electrons are directly injected from the semiconductor substrate 11 to the base layer 13 as indicated by the arrow broken line e in FIG. 4. The junction between the first anode region 14 and the base layer 13 is forward-biased as described above. The first anode region 14 and the anode electrode 20 are electrically connected. In response to the amount of electrons injected from the semiconductor substrate 11 to the base layer 13, therefore, holes are injected from the anode electrode 20 through the first anode region 14 to the base layer 13 as indicated by the arrow broken line h in FIG. 4. The base layer 13 is thus in a highly-injection state and causes conductivity modulation, resulting in an extremely low resistance and a turned-on state (a latch-up state).

Figure 5:
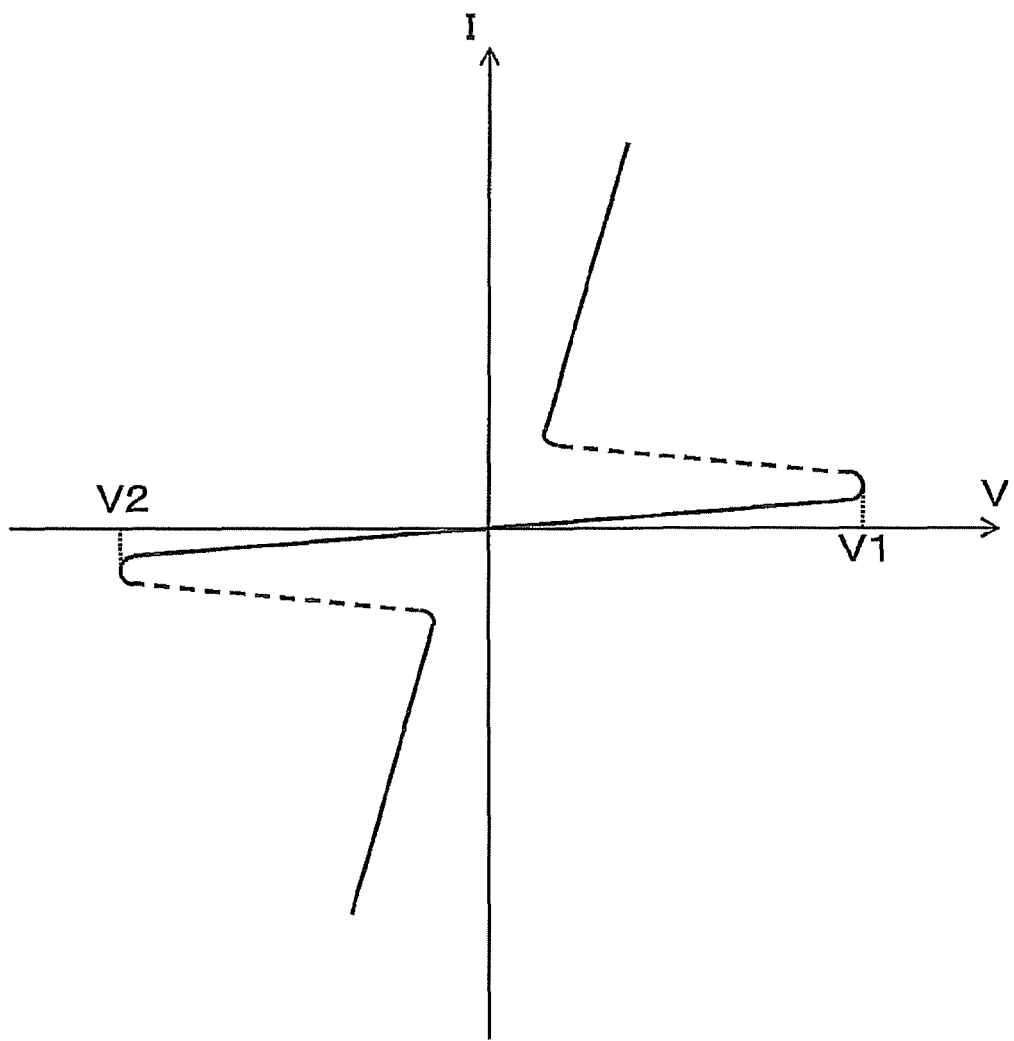
FIG. 5 shows the relationship between a voltage and a current of the semiconductor device of the embodiment.

FIG. 5 shows the relationship between a voltage and a current (V-I) of the trigger diode shown in FIGS. 3 and 4. In FIG. 5, the breakdown voltage of the junction between the base layer 13 and the first anode region 14 is defined as V1. In addition, the breakdown voltage of the junction between the base layer 13 and the cathode layer 12 is defined as V2. When a voltage between V2 and V1 is applied to the anode electrode 20 relative to the cathode electrode 22, the trigger diode of this embodiment is in a turned-off state. Only an extremely low leak current thus flows. When, however, a voltage higher than V1 or lower than V2 is applied to the anode electrode 20 relative to the cathode electrode 22, a trigger diode is changed to a turned-on state. The resistance between the anode and the cathode thus rapidly decreases, allowing a large current to flow.

The trigger diode of this embodiment may therefore rapidly move to the turned-on state even when it is applied with a high-voltage pulse that may be caused by the ESD. The device to be protected may thus be prevented from the ESD breakdown caused by a high voltage applied across the terminals of the device.

In the trigger diode of this embodiment, both the n and P-type semiconductor regions are formed on a single side of the semiconductor substrate 11. It is thus possible to manufacture the diode without a complicated manufacturing process. It is also possible to provide the back side processing for a thinner and more compact diode.

Figure 6:
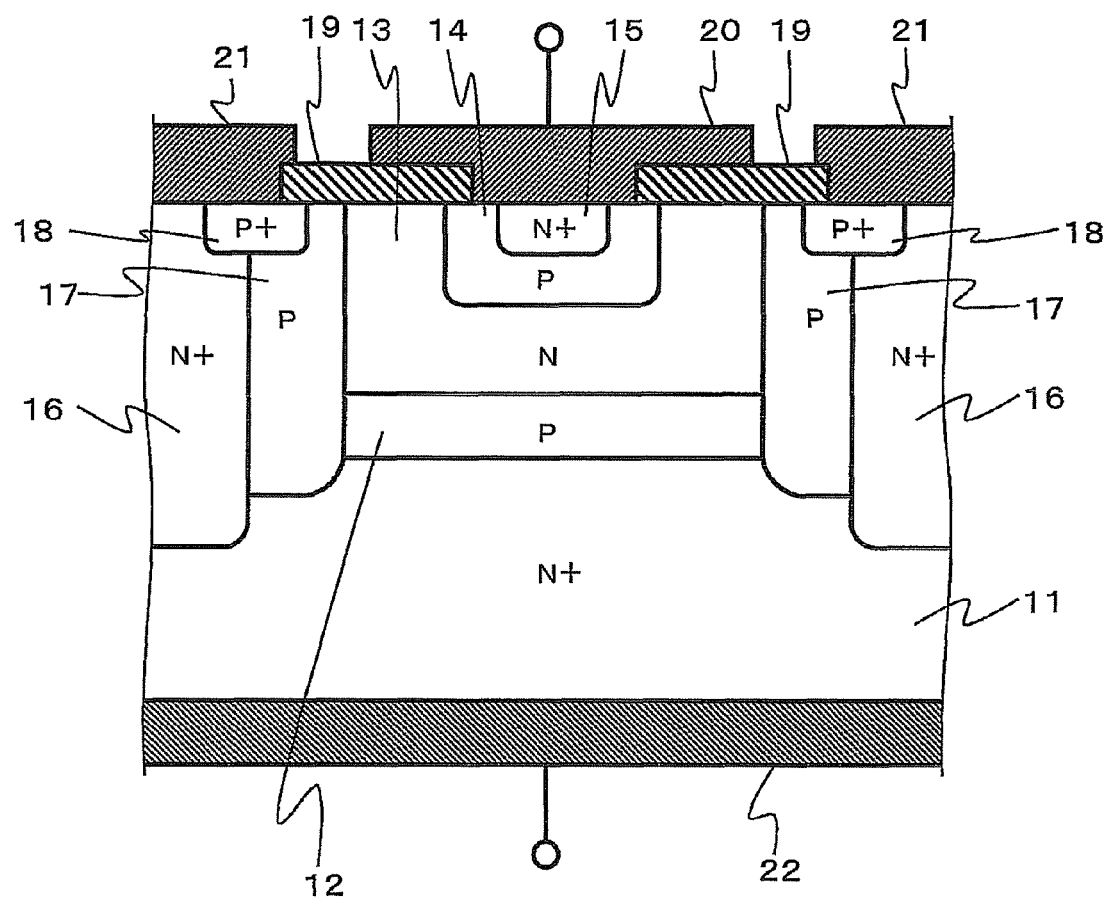
FIG. 6 shows a structure of a semiconductor device according to another embodiment of the present invention.

Although this embodiment has been described with respect to a semiconductor device having the configuration shown in FIG. 1, the present invention is not limited thereto. With reference to FIG. 6, the second semiconductor region 17 may be formed in contact with the semiconductor substrate 11 at its bottom surface and in contact with the cathode layer 12 at its side surface.

Thus, the semiconductor device according to the preferred embodiments of the present invention have been described in detail, but the present invention is not limited to the embodiments, and other embodiments may also be utilized.

What is claimed is:

1. A semiconductor device comprising:
a semiconductor substrate of a first conductivity type and a cathode layer of a second conductivity type formed on the semiconductor substrate;
a base layer of the first conductivity type formed on the cathode layer;
a first anode region of the second conductivity type formed in a surface of the base layer;
a second anode region of the first conductivity type formed in the first anode region;
a first semiconductor region of the first conductivity type formed on the surface of the base layer and in contact with the semiconductor substrate, said first semiconductor region being apart from the first anode region;
a second semiconductor region of the second conductivity type formed adjacent to the first semiconductor region and in contact with the cathode layer, said second semiconductor region being apart from the first anode region;
a contact region of the second conductivity type formed in a surface including a boundary portion between the first semiconductor region and the second semiconductor region;
a cathode electrode formed on a surface of the semiconductor substrate;
an anode electrode formed on surfaces of the first anode region and the second anode region; and
an intermediate electrode formed on surfaces of the first semiconductor region and the contact region.

2. The semiconductor device according to claim 1, wherein between the anode electrode and the intermediate electrode, at least surfaces of the base layer and the second semiconductor region are covered by an insulating layer.

3. The semiconductor device according to claim 1, wherein the first semiconductor region, the second semiconductor region, and the contact region are formed circumferentially around the first anode region, and the intermediate electrode is formed circumferentially around the anode electrode.

4. The semiconductor device according to claim 1, wherein the second semiconductor region is formed adjacent to the cathode layer at its bottom surface.

5. The semiconductor device according to claim 1, wherein the second semiconductor region is formed in contact with the cathode layer at its side surface and in contact with the semiconductor substrate at its bottom surface.

6. The semiconductor device according to claim 1, wherein the first semiconductor region, the intermediate electrode, the contact region, the second semiconductor region, and the cathode layer flow a hole current when a potential difference between the anode electrode and the cathode electrode is equal to or higher than a predetermined value.

7. The semiconductor device according to claim 1, wherein the first conductivity type is an N-type and the second conductivity type is a P-type, and wherein when the cathode electrode voltage is higher than the anode electrode voltage by a predetermined value or more, the base layer has conductivity modulation caused by a hole current injected through the first semiconductor region, the intermediate electrode, the contact region, the second semiconductor region and the cathode layer, and an electron current injected through the first anode region and the second anode region.

8. The semiconductor device according to claim 1, wherein the first conductivity type is an N-type and the second conductivity type is a P-type, and wherein when the anode electrode voltage is higher than the cathode electrode voltage by a predetermined value or more, the base layer has conductivity modulation caused by a hole current injected through the first anode region and an electron current injected from the cathode layer.

9. The semiconductor device according to claim 8, wherein the hole current changes in response to an amount of the electron current.

10. The semiconductor device according to claim 8, wherein when the anode electrode voltage is higher than the cathode electrode voltage by a predetermined value or more, a hole current flows from the cathode layer through the second semiconductor region, the contact region, the intermediate electrode, and the first semiconductor region to the semiconductor substrate.

11. A semiconductor device comprising:
- a semiconductor substrate of a first conductivity type and a cathode layer of a second conductivity type formed on the semiconductor substrate;
- a base layer of the first conductivity type formed on the cathode layer;
- a first anode region of the second conductivity type formed in a surface of the base layer;
- a second anode region of the first conductivity type formed in the first anode region;
- a first semiconductor region of the first conductivity type formed on the surface of the base layer and in contact with the semiconductor substrate, said first semiconductor region being apart from the first anode region;
- a second semiconductor region of the second conductivity type formed adjacent to the first semiconductor region and in contact with the cathode layer, said second semiconductor region being apart from the first anode region;
- a cathode electrode formed on a surface of the semiconductor substrate;
- an anode electrode formed on surfaces of the first anode region and the second anode region; and
- an intermediate electrode formed on surfaces of the first semiconductor region.

12. The semiconductor device according to claim 11, wherein
between the anode electrode and the intermediate electrode, at least surfaces of the base layer and the second semiconductor region are covered by an insulating layer.

13. The semiconductor device according to claim 11, wherein
the first semiconductor region and the second semiconductor region are formed circumferentially around the first anode region, and
the intermediate electrode is formed circumferentially around the anode electrode.

14. The semiconductor device according to claim 11, wherein
the second semiconductor region is formed adjacent to the cathode layer at its bottom surface.

15. The semiconductor device according to claim 11, wherein
the second semiconductor region is formed in contact with the cathode layer at its side surface and in contact with the semiconductor substrate at its bottom surface.

16. The semiconductor device according to claim 11, wherein
the first semiconductor region, the intermediate electrode, the second semiconductor region, and the cathode layer flow a hole current when a potential difference between the anode electrode and the cathode electrode is equal to or higher than a predetermined value.

17. The semiconductor device according to claim 11, wherein
the first conductivity type is an N-type and the second conductivity type is a P-type, and wherein
when the cathode electrode voltage is higher than the anode electrode voltage by a predetermined value or more, the base layer has conductivity modulation caused by a hole current injected through the first semiconductor region, the intermediate electrode, the second semiconductor region and the cathode layer, and an electron current injected through the first anode region and the second anode region.

18. The semiconductor device according to claim 11, wherein
the first conductivity type is an N-type and the second conductivity type is a P-type, and wherein
when the anode electrode voltage is higher than the cathode electrode voltage by a predetermined value or more, the base layer has conductivity modulation caused by a hole current injected through the first anode region and an electron current injected from the cathode layer.

19. The semiconductor device according to claim 18, wherein
the hole current changes in response to an amount of the electron current.

20. The semiconductor device according to claim 18, wherein
when the anode electrode voltage is higher than the cathode electrode voltage by a predetermined value or more, a hole current flows from the cathode layer through the second semiconductor region, the intermediate electrode, and the first semiconductor region to the semiconductor substrate.

* * * * *